United States Patent
Samant et al.

(10) Patent No.: US 6,668,447 B2
(45) Date of Patent: Dec. 30, 2003

(54) MULTILAYERED BOARD COMPRISING FOLDED FLEXIBLE CIRCUITS AND METHOD OF MANUFACTURE

(75) Inventors: Sanjiv Singh Samant, Cordova, TN (US); Jinesh Jitendra Jain, Memphis, TN (US); Joseph Laughter, Millington, TN (US)

(73) Assignees: St. Jude Children's Research Hospital, Memphis, TN (US); The University of Tennessee Research Corporation, Knoxville, TN (US)

( * ) Notice: Subject to any disclaimer, the term of this patent is extended or adjusted under 35 U.S.C. 154(b) by 0 days.

(21) Appl. No.: 10/242,377

(22) Filed: Sep. 12, 2002

(65) Prior Publication Data

US 2003/0095389 A1 May 22, 2003

Related U.S. Application Data

(62) Division of application No. 09/989,626, filed on Nov. 20, 2001.

(51) Int. Cl.[7] ................................................. H05K 3/36
(52) U.S. Cl. ............................ 29/830; 29/825; 29/840; 29/846
(58) Field of Search ........................ 29/840, 845, 846, 29/830, 825

(56) References Cited

U.S. PATENT DOCUMENTS

| | | |
|---|---|---|
| 3,501,830 A | 3/1970 | Bryzinski et al. |
| 3,819,989 A | 6/1974 | Braume |
| 4,742,183 A | 5/1988 | Soloway et al. |
| 4,849,617 A | 7/1989 | Ueda ........................... 235/492 |
| 4,928,206 A | 5/1990 | Porter et al. ................. 361/385 |
| 4,990,724 A | 2/1991 | Suppelsa ..................... 174/261 |
| 5,004,899 A | 4/1991 | Ueda ........................... 235/492 |
| 5,117,282 A | 5/1992 | Salatino |
| 5,224,023 A | 6/1993 | Smith et al. ................. 361/412 |
| 5,398,163 A | 3/1995 | Sano ........................... 361/749 |
| 5,432,998 A | 7/1995 | Jalasco et al. |
| 5,754,409 A | 5/1998 | Smith .......................... 361/803 |
| 5,917,158 A | 6/1999 | Takao et al. ................. 174/254 |
| 5,986,886 A | 11/1999 | Sasov |
| 5,996,222 A | 12/1999 | Shangguan et al. |
| 6,112,034 A | 8/2000 | Takao et al. ................. 396/542 |

*Primary Examiner*—Carl J. Arbes
(74) *Attorney, Agent, or Firm*—Klauber & Jackson

(57) ABSTRACT

An easier and cheaper way to obtain multilayer circuit board is by using a flexible circuit board and folding it in an organized pattern. Flexible circuit has the unique property of being a three-dimensional circuit that can be shaped in multiplanar configurations, rigidized in specific areas, and molded to backer boards for specific applications. The folded circuit is fabricated from a series of foldable circuit board strips and rigid circuit board strips which are interconnected, folded, and bonded into a composite structure. The foldable strips may have prefolds arranged so that a group of upper foldable strips and lower foldable strips are folded in opposite directions. A plurality of intermediate portions are stacked on each other by the folding the foldable strips in opposite directions. The folded circuit, can be bonded after a first fold, or folded further to achieve a greater reduction in area and subsequently be bonded as a composite multilayer structure.

6 Claims, 10 Drawing Sheets

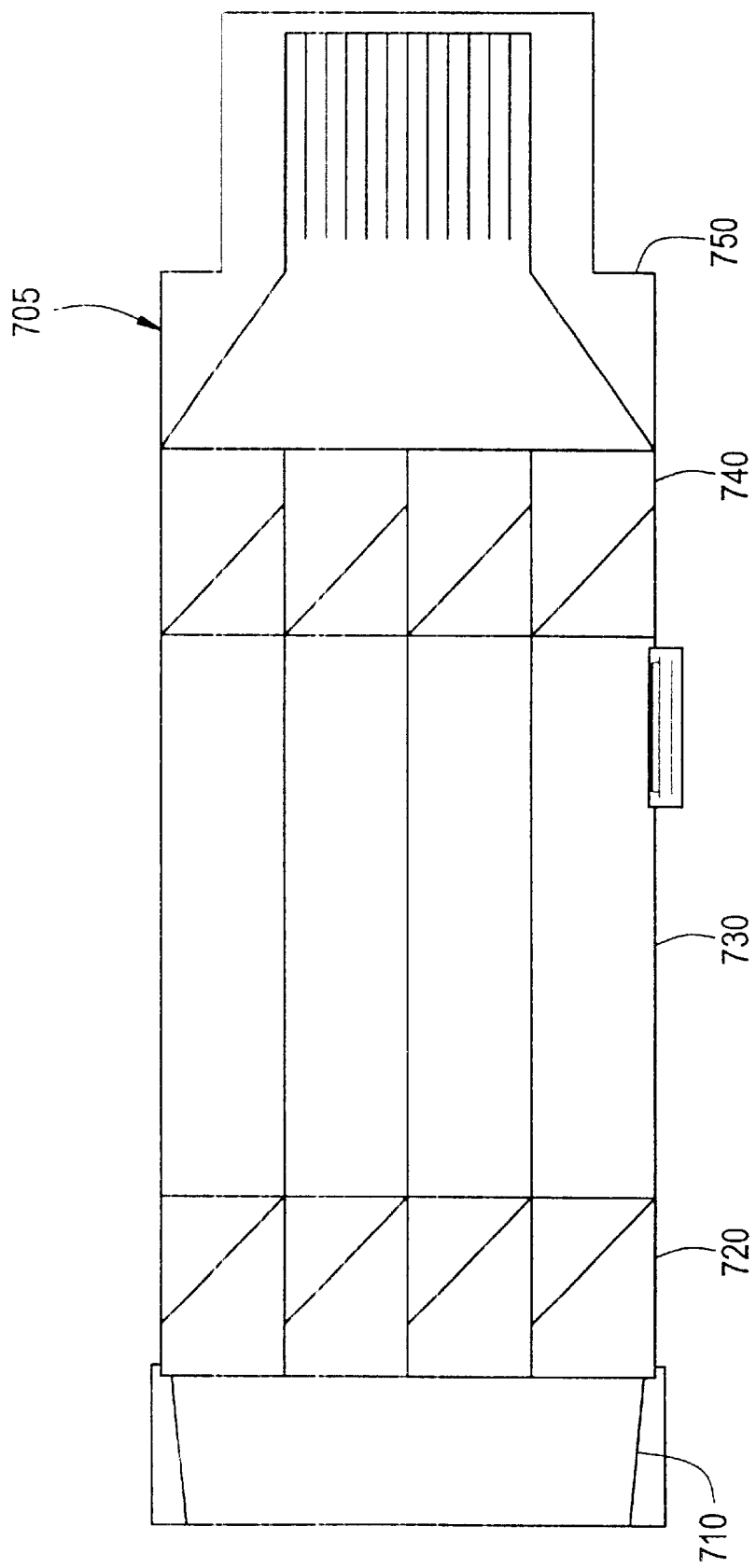

MULTILAYERED BOARD COMPRISING FOLDED FLEXIBLE CIRCUITS AND METHOD OF MANUFACTURE

This application is a Divisional application of U.S. Ser. No. 09/989,626, filed Nov. 20, 2001.

GOVERNMENT RIGHTS

The research leading to the present invention was supported, in part, by the following grant from the National Institutes of Health/National Cancer Institute: CA76061-05. Accordingly, the United States Government may have certain rights in the invention.

BACKGROUND OF THE INVENTION

1. Field of the Invention

The present invention relates to multilayer circuit boards and folded flexible circuit boards.

2. Description of the Related Art

Primarily flexible circuits are used to solve problems with interconnection of rigid circuit boards. This new structure offers the advantages of increased reliability, weight and space savings, a reduction in mechanical connectors, and greater impedance control.

Four types of flexible circuits are prevalent today: single-side, double-sided, rigid-flex and multilayer. Single-sided circuits, consisting of a single layer of conductors on a base film, are most commonly used in interconnection applications. A double-sided flexible circuit has a single-etched conductive pattern on both sides of the base film. It is used when circuit density and layout cannot be routed on one layer, and in ground plane applications.

Rigid-flex circuitry traditionally consists of both rigid and flexible substrates selectively laminated together into a single cohesive construction, electrically interconnected with electroplated holes or 'via'. The rigidized area can be used to mechanically reinforce the circuit board in an area subject to increased abrasion or other forms of stress.

Multilayer flexible circuits consist of a sandwich formed by many layers of copper, between the dielectric substrates, and are used primarily in high-density applications. Conventional multilayer printed circuit boards consist of a number of thin boards sandwiched together between layers of epoxy resin-impregnated glass cloth. Connections between layers are achieved by means of plated via holes.

In the prior art, there have been some attempts to provide foldable flexible circuit boards.

For example, U.S. Pat. No. 4,928,206 by Porter et al. discloses a number of rigid circuit boards connected by a number of flexible circuit panels. Integrated circuit boards are mounted on the rigid printed circuit boards. The boards are foldable to reduce the entire unfolded layout in one direction, either width or length. Such a configuration is attached serially and folds along the flexible portions from a completely unfolded position to a most compact folded position.

Another flexible printed circuit board, by Takao et al. (U.S. Pat. No. 5,917,158), discloses a single circuit board having a main body and a folding portion as part of the single circuit board and wherein a set of copper foil lines provided on both the main body and the folding portion so that the folding portion overlaps the main body so that terminals at the ends of the copper foil lines make electrical contact with each other.

Furthermore, U.S. Pat. No. 5,398,163 by Sano discloses a flexible printed circuit board having at least one electrically conductive layer, and a fold retainer pattern which is electrically isolated from the printed circuit pattern. The fold retainer pattern maintains its folded shape once the flexible sheet is folded.

In the above devices, as well as in other prior art devices, there are a series of rigid circuits which in one way fold via flexible connections, to reduce the open layout of the circuitry in one direction. In the above patents, the folding circuit board serves to reduce the unfolded area of the circuit board in order to minimize the space taken up by the circuit board, or fit a series of rigid circuit boards by flexible connectors in order to conform to the desired space available. No consideration is given to the nature of the folding, or situations where there are theoretical limitations to the space available or very low current signals where one seeks to minimize inter-channel crosstalk or capacitance.

However, in certain electronic devices further reductions in compactness is required, specifically in circuit boards utilizing high density of conductor lines where space constraints limit the circuit board size. For example, in a Kinestatic Charge Detector (KCD, U.S Pat. No. 4,764,679 by McDaniel et al.), a strip-beam, multielectrode ionization chamber is used to produce a high-resolution digital radiographic image of a subject. The KCD utilizes a high-pressure rare gas as the uniform detection medium enclosed in a tubular chamber. X-rays after passing through the subject enter the chamber and ionize the gas forming charge pairs (ion-electrons). An externally induced precisely controlled electric field within the chamber is used to direct the positive ions at a constant velocity towards the collector electrodes or channels. The collector electrodes accumulate the current induced by the ions and the signal from these electrodes is read out by the interfacing electronics. In other words, the uniform detection medium contains spatial information that is read out as the ions approach the collectors.

Current circuit board manufacturing technology sets the minimum separation between conductor lines of a KCD at 0.013 cm for a conductor width of 0.013 cm for large circuit boards. (For a much smaller circuit board area, smaller conductor widths and separations on the order of a couple of hundred nanometers are possible.) According to the current technology, it would require, at least, 15 cm of circuit board width just to lay 576 conductors (signal channels for the KCD). These conductors need to be taken out of the chamber with the help of vias that need a hole of bigger size to be drilled on the circuit board surface for each conductor. With the vias, the total width of circuit board needed is about 30 cm. However, the maximum available width of the circuit board is dictated by the inner diameter of the chamber, which in turn is limited by the minimization of the detector size needed for clinical efficacy and a maximum practical size for maximal imaging signal. For an inner diameter of 11.25 cm (as used for the prototype KCD detector designed for megavoltage imaging), the collector board can be, at the most, 10 cm wide for a 0.5 cm clearance all around the edge required for mechanical alignment.

To be able to route all the channels out of the chamber, one approach is to fabricate the collector board in two parts with half the number of channels on each. The total number of channels will still have to be reduced to 480 (which may be allowed) because of limited width available. Each board can be double-sided with the collecting electrodes on one surface and its routing path via the second surface (back surface). The two boards must be accurately aligned inside the chamber since even a small misalignment can cause a loss in resolution and/or damage to the circuit board and the grid.

Apart from alignment issues relating the two board parts, the collector board itself must be precisely positioned within the chamber, very close to the grid (typically 0.2 B 0.5 mm). Inserting the boards from both ends introduces a blindfolded step in the assembly process; since at least one board must be inserted through the end cap after the detector is assembled, making it difficult to determine when the two boards exactly meet. If the boards are pressed too hard against each other, they might damage each other and cause bowing of the board, ultimately short-circuiting the grid. On the other hand, if the boards are not pressed enough, they may not be touching each other at all, thereby causing a loss of signal and vital channel information. To ensure uniform signal collection, the two boards have to be on the same level and exactly touching, so that the spacing between the first conductors on the two boards is the same as the spacing between all other conductors. This spacing requires tight tolerances and a highly complicated design to get a working chamber, making this solution impractical.

Another approach to the above problem is to reduce the number of channels so that they can be accommodated in the available circuit board width i.e. 9 cm. This means fewer channels to collect the signal, or in other words, a lower spatial resolution or a reduced field of view, either of which is unacceptable. Yet another solution is to increase the tube diameter, which is not practical due to space and weight limitations imposed by the clinical gantry.

Multilayering technique in circuit boards is the most effective conventional approach to address the above problem. Conventional multilayer printed circuit boards consist of a number of thin boards sandwiched together between layers of epoxy resin-impregnated glass cloth. Connections between layers are achieved by means of electroplated holes or vias. The 576 channels on the surface of the circuit board can be routed on different layers that are bonded together. By routing the channels on to different layers, the width of the board no longer dictates the number of channels. Using this technique, the channels on the circuit board can be made to exit from only from one end of the chamber, rather than two ends. This way, there are no complicated alignment issues since there is only one circuit board and the blindfolded step is eliminated.

The manufacturing process for multilayer printed circuit boards starts with the fabrication of the individual component layer boards, excluding the outermost layers. Each of the internal layers needs to be fabricated from thinner substrates than for stand-alone boards. Each internal layer needs to be thoroughly cleaned in abrasive slurry to remove any contaminants. The layers are then baked in an oven to drive off any gases, which could cause separation of the final board due to bubble formation during bonding. The layers are built up as a sandwich on a jig that achieves the necessary alignment using jigging holes. The various internal layers are added, each layer being interleaved with a layer of epoxy-resin-impregnated glass cloth. A sheet of copper foil and a protective film complete the sandwich structure and form the second-outermost layer. It is vitally important that the jigging ensures the correct alignment of the constituent layers during this process. Once assembled, the board is bonded together by heating in a press. After pressing, a routing process is performed to remove any resin material that has been extruded around the edges of a board during pressing.

The processing commences with the pre-processing and CNC drilling processes. It is important that the drilling process is carefully controlled so as to produce a smooth hole and to minimize the amount of resin smear.

The next process is the through-hole plating. This plating process must connect the internal copper layers of the board in addition to connecting the outer copper layers together. Cleaning and the application of solder are then used to finish the construction of the multilayer board.

Based on the need for staggered conductor connections, the circuit board will have to undergo multiple electroplating processes, making the technique expensive. There are other problems too with this conventional multilayering. Holes, with pads, are introduced on the front surface, that are bigger in size than the conductor width, thereby reducing the space between them and increasing the capacitance. The presence of these holes can also restrict the number of available channels. Apart from this, other problems like high transmissions of acoustic vibrations and rigid connector board geometry are also significant.

Therefore, there exists a need in the art for a more compact circuit board having a much greater ratio of open area to folded area so as to be usable in devices where space is limited or overall a reduction in size is desired, and a multilayer circuit board having a much less complicated manufacturing process.

SUMMARY OF THE INVENTION

Accordingly, the present invention provides a heretofore unknown approach to folding a flexible circuit board to achieve maximal compactness. This folding is done by determining the folding pattern as a function of the space available for the circuit board, the density of conductor lines, conductor routing constraints, and the mechanical properties of the flexible circuit board.

To ensure that the folded circuit board pattern is highly reproducible and meets a high degree of alignment needed in certain applications (such as a KCD detector), the folding pattern should involve a repeatable-layered geometric pattern. The actual folding pattern to achieve optimal compactness depends on the application and space available. The folded circuit board can be left loose or laminated depending on the mechanical constraints. As well, multiple rigid and non-rigid fasteners can be used to increase the mechanical integrity and utility of the folded circuit board.

Accordingly, it is an object of the present invention to provide a multilayer folded flexible circuit board comprising:

a lower rigid portion having a circuit pattern arranged thereon;

at least one lower foldable strip having a circuit pattern thereon adapted at one end for connection to the circuit pattern of the lower rigid portion and electrically connected thereto;

at least one intermediate portion having a circuit pattern arranged thereon which at a first end is electrically connected to an opposite end of the at least one lower foldable strip;

at least one upper foldable strip having a circuit pattern arranged thereon which is electrically connected to the at least one intermediate portion at a second end of the intermediate portion; and a connector board electrically connected to an opposite end of the at least one upper foldable strip, the connector board adapted for receiving connectors to provide external attachment to the folded flexible circuit board; wherein the at least one lower foldable strip and the at least one upper foldable strip fold along diagonal lines in opposite directions of each other.

According to an aspect of the invention, the diagonal folding lines of the lower and upper foldable strips are arranged at respective 45° degree angles across each respective foldable strip.

According to another aspect of the invention, the at least one lower foldable strip comprises of four equally sized foldable strips having space therebetween, and the at least one intermediate portion comprises four rigid portions, and The four equally sized lower foldable strips and the four equally sized intermediate portions have a matching number of electrical patterns so that a particular lower foldable strip electrically connects to a particular respective intermediate rigid portion of the four equally sized intermediate portions.

According to still another aspect of the invention, the at least one upper foldable strip comprises four equally side foldable strips having space therebetween, each respective upper foldable strip is electrically connected to a respective intermediate portion of the four equally sized intermediate portions.

According to yet another aspect of the invention, the at least one lower foldable strip and the at least one upper foldable strip may be prefolded to impart a specific folding point across the respective lower or upper foldable strip.

According to another aspect of the invention, the at least one lower foldable strip and the at least one upper foldable strip are diagonally folded in opposite directions of each other.

The lower rigid portion may be laminated subsequent to the diagonal folding of the lower and upper foldable strips.

In addition, the lamination of the intermediate portions can include FR4 on its backside.

According to another aspect of the invention, one of either right-most or the left-most lower foldable strip further comprises a tab on an outer side thereof.

The lower foldable strips and the upper foldable strips may be diagonally folded in opposite directions.

The lower foldable strips and the upper foldable strips can be diagonally folded in opposite directions, so that the intermediate portions are at least partially stacked on each other.

The lower rigid portion is stacked onto the stack of rigid intermediate portions by horizontally folding the lower foldable strips so that the lower rigid portion is flipped upward onto the intermediate portions.

According to another aspect of the invention, the connector board is stacked onto the upper foldable strips by horizontally folding the upper foldable strips so that the connector board is flipped onto the upper foldable strips, and the upper foldable strips are at least partially stacked on the intermediate portions.

According to another aspect of the invention, the stack of the intermediate portions, the lower rigid portion, the upper foldable strips and the connector board are all bonded together as a composite multilayer structure.

In a second embodiment of the invention, a Kinestatic Charge Detector comprises the folded flexible circuit board according to the present invention, wherein the lower rigid portion comprises a collector board; and the Kinestatic Charge Detector comprises a tubular chamber; and the folded flexible circuit board is arranged within the tubular chamber so that only the connector board extends therefrom.

A process for manufacturing a folded flexible circuit board comprising the steps of:

(a) providing a circuit board comprising a lower rigid portion, a plurality of lower foldable strips electrically connected to the lower rigid portion, a plurality of intermediate portions connected at a first end to a second end of the lower foldable strips, a plurality of upper foldable strips connected to a second end of the intermediate portions, and a connector board connected, to an opposite end of the upper foldable strips;

(b) folding the lower foldable strips and the upper foldable strips diagonally in opposite directions to each other so that each of the intermediate portions are at least partially stacked upon each other;

(c) folding the lower rigid portion back on the stack of intermediate portions by folding the lower foldable strips horizontally so that the lower rigid portion stacks on the intermediate portions; and (d) folding the connector board onto the upper foldable strips and the stack of intermediate-rigid portions by folding the upper foldable strips horizontally so that the connector board stacks on the upper foldable strips and the intermediate portions.

Another aspect of the method according to the present invention further comprises:

(e) bonding the folded flexible circuit board into a folded composite multilayer structure.

In yet another aspect of the method according to the present invention, step (b) first includes:

(i) providing diagonal prefolds on the lower foldable strips and the upper foldable strips so that the strips fold in opposite directions.

According to another aspect of the method of the present invention, step (a) includes providing a tab to at least an outer edge of one of a right-most and left-most intermediate portion.

Finally, the method according to the present invention may include laminating a backside of the intermediate portions.

BRIEF DESCRIPTION OF THE DRAWINGS

FIG. 7B illustrates the folded flexible circuit board of FIG. 2 constructed for use in a Kinestatic Charge Detector.

DETAILED DESCRIPTION OF THE PREFERRED EMBODIMENTS

The embodiments discussed herein below are for illustrative purposes only, and do not limit the scope of the appended claims. The multi-layer folded flexible technology can be used in virtually any device where it would be desirable to provide reductions in circuit size, and the example of such technology in a Kinestatic Charge Detector (KCD) is only one such advantageous embodiment of the invention.

First Embodiment

FIGS. 1–5 show a first embodiment of the present invention.

Figure 1:
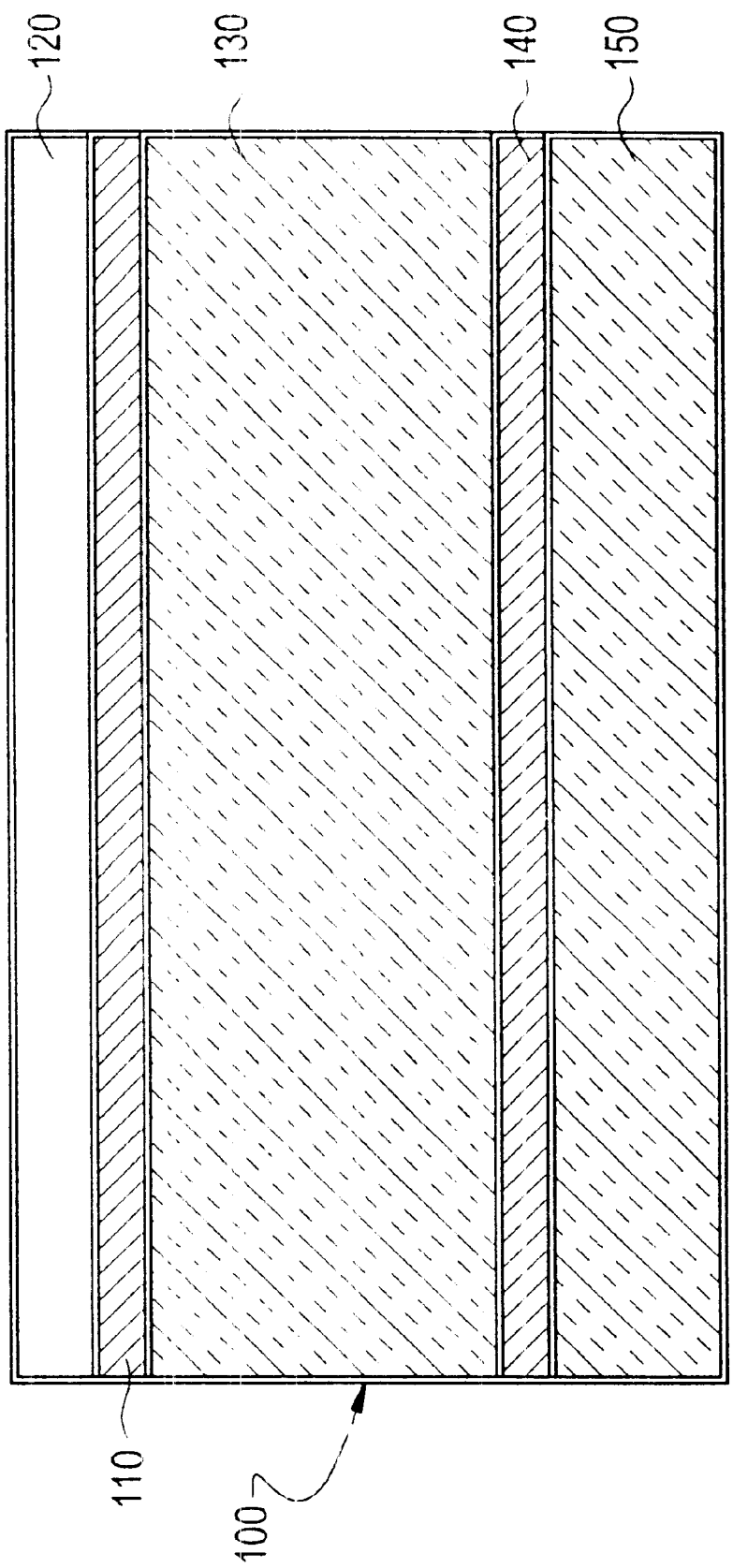
FIG. 1 illustrates the layering of a flexible circuit board used in the folded flexible circuit board of the present invention.

FIG. 1 shows the basic structure of a flexible circuit board 100 used in the foldable circuit device of the present invention.

An exposed layer of copper 110 is coated with a photosensitive material 120. The copper layer has been etched into a circuit pattern prior to coating. Alternatively, other materials, such as a printed polymer thick film circuit pattern may be arranged over a flexible dielectric circuit base.

An insulation layer 130 is arranged between layer 110 and ground plate 140. A bottom insulator 150 is disposed on the lower portion of the ground plate 140.

Figure 2:
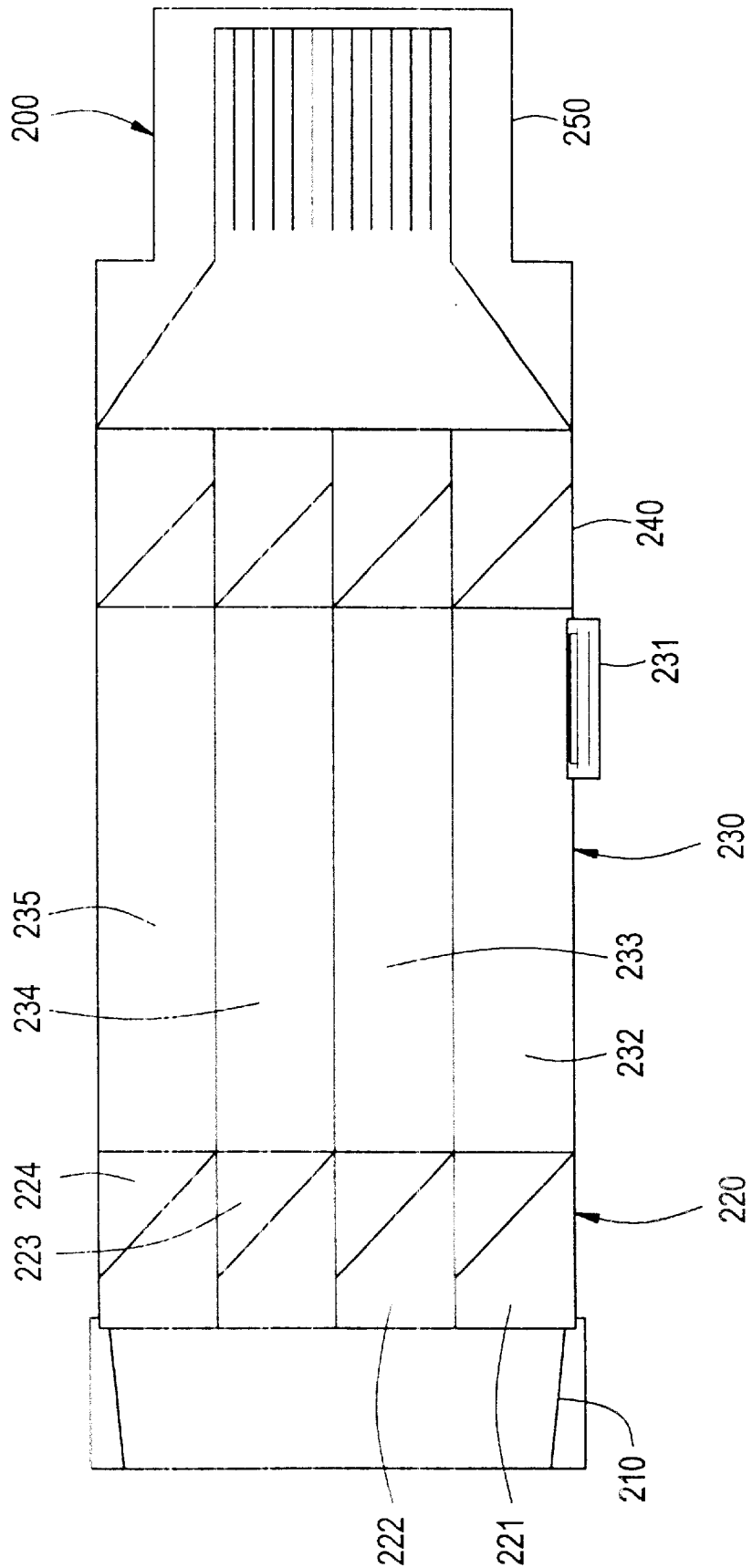
FIG. 2 illustrates a folded flexible circuit board device according to the present invention.

FIG. 2 illustrates an embodiment of the foldable flexible circuit device 200 of the present invention. The circuit is laid out on a flexible substrate, such as the type shown in FIG. 1 and described above.

According to the embodiment shown in FIG. 2, there is a lower rigid portion 210 at a first end which is connected to four separate lower foldable strips 220 of a flexible circuit board. The separation of the strips is accomplished by cutting vertical slots (as indicated by the solid vertical lines between the strips 220, or could be four entirely separate strips attached to the lower rigid portion 210. Each lower foldable strip 220 has a portion of the conductor connected to the conductors in the lower rigid portion 210. For example, if the rigid portion has 1000 conductors, each of the first lower foldable strips may have 250 conductors each.

FIG. 2 also shows that the lower rigid portion 210 appears to be somewhat tapered. Actually, this structure is a fanning out of the conductors from the bottom of the lower rigid portion so as to maintain uniform width and conductor spacing from the lower rigid portion. While it is possible for the lower foldable strips to have uneven apportionment's of conductors with nonuniform spacing, an equal amount of conductors spaced at uniform widths is a preferred best mode.

The lower foldable strips 220 comprise individual strips 221–224, as shown in FIG. 2, with each having a diagonal line, which represents a folding line or a crease in the strips. The lower foldable strips can be prefolded at a select position to impart a specific folding point across the strips, and then unfolded during the connection process to the lower rigid portion.

Intermediate portion 230 comprises strips 232–235, and are connected to the opposite end of the lower foldable strips. In this embodiment, there are four intermediate portions so as to correspond with the four lower foldable strips 220. One of the outer strips 232 has a tab on its side 231, which can provide attachment for extra conductors from an external source. Similar to the lower foldable strips 221–224, the intermediate portions are separate strips (indicated by the vertical lines) of circuit board, which may have been fabricated from a single board cut into four pieces, or four separately formed boards. It is envisioned that the intermediate portions 232–235 will have a corresponding number of and uniformly spaced conductors, as do the lower foldable strips 220. A person of ordinary skill in the art understands that the quantities of strips can be more or less than four according to need.

Upper foldable strips 240 are connected to an opposite end of the intermediate portion 230. Similar to the lower foldable strips 220, the upper foldable strips are flexible, have a corresponding number of conductors as the intermediate portions 232–235 with uniform spacing, and have vertical slots cut therein (as represented by the vertical lines) and diagonal folding lines or creases therein (as represented by the respective diagonal lines) across each upper foldable strip 240.

However, it should be noted that the folds in the upper foldable strips would counter the folds in the lower foldable strips. For example, assuming that the device shown in FIG. 2 is fully extended and has a relatively flat planar top surface, when folded, the top surface of the upper foldable portions will fold toward each other, while the top surface of the lower foldable portions will fold away from other.

Connector board 250 is connected to the opposite end of the upper foldable strips 240. It is at the connector board that the conductors will be connected to connectors. The conductors may be grouped into predetermined numbers to facilitate a particular connector.

The diagonal lines across lower foldable strips 220 and upper foldable strips 240 are placed at 45-degree angles for this embodiment to assist in their folding over.

Figure 3:
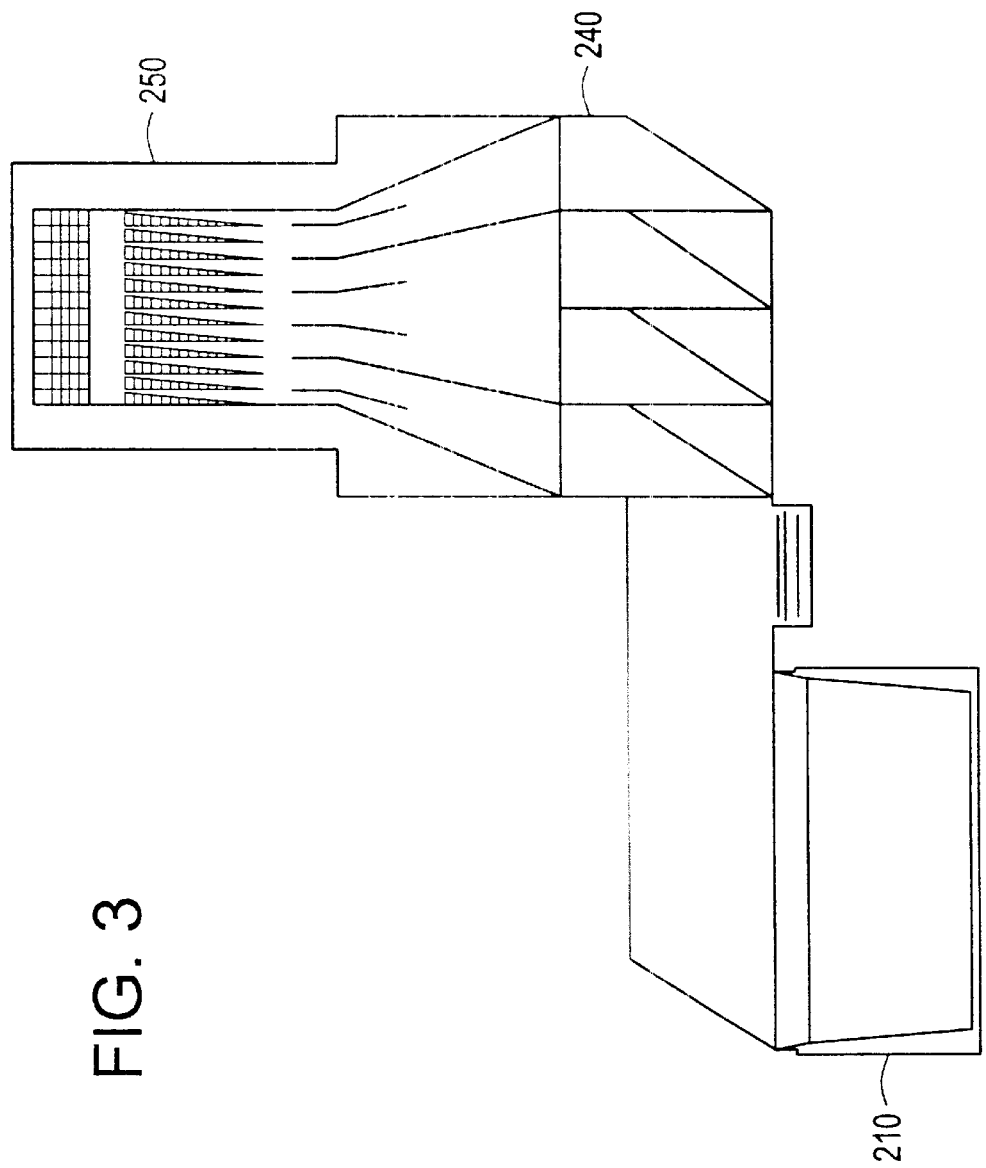
FIG. 3 illustrates the arrangement of the structure of the flexible circuit board device after a first folding step.
Figure 4:
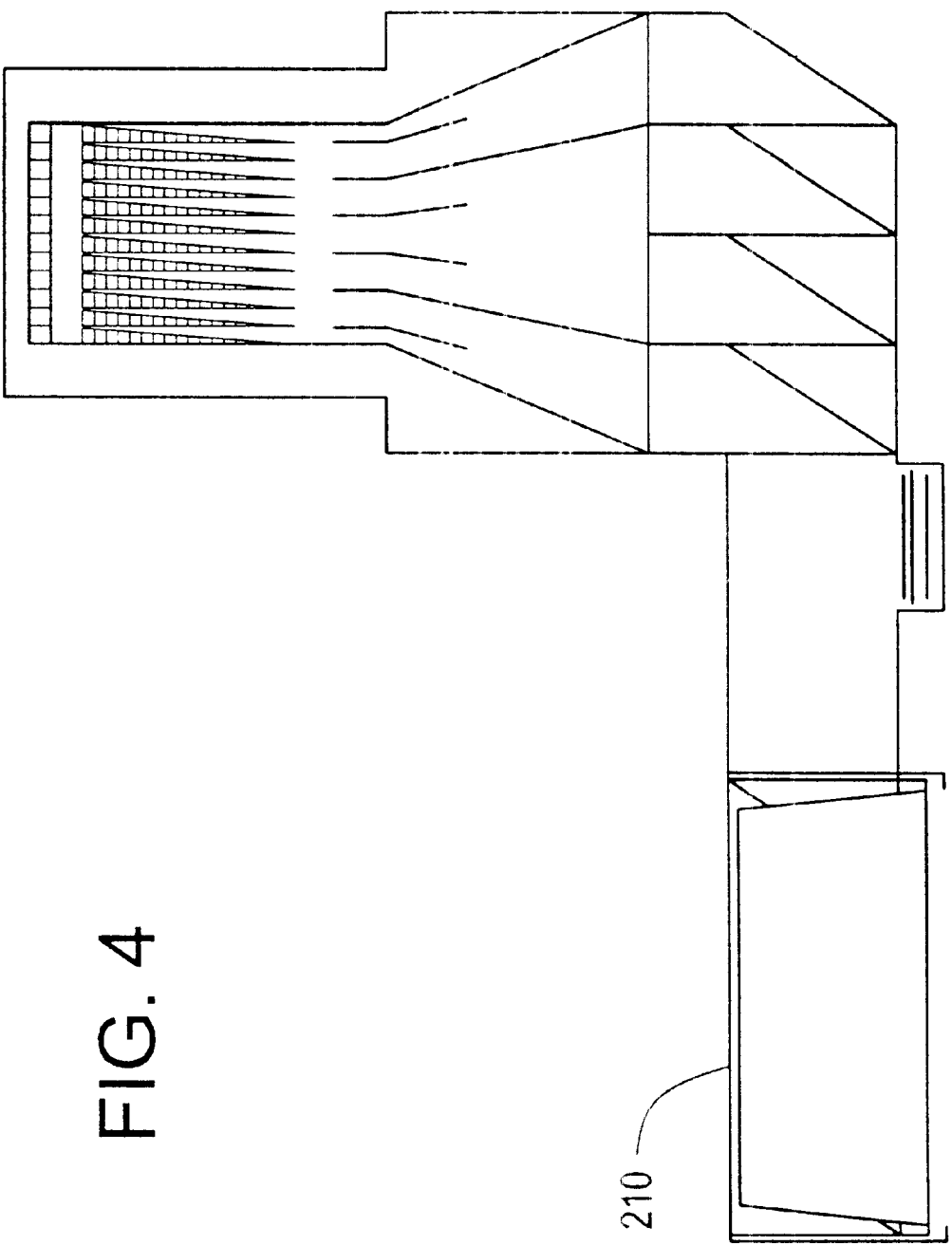
FIG. 4 illustrates the arrangement of the structure of the flexible circuit board device after a second folding step.
Figure 5:
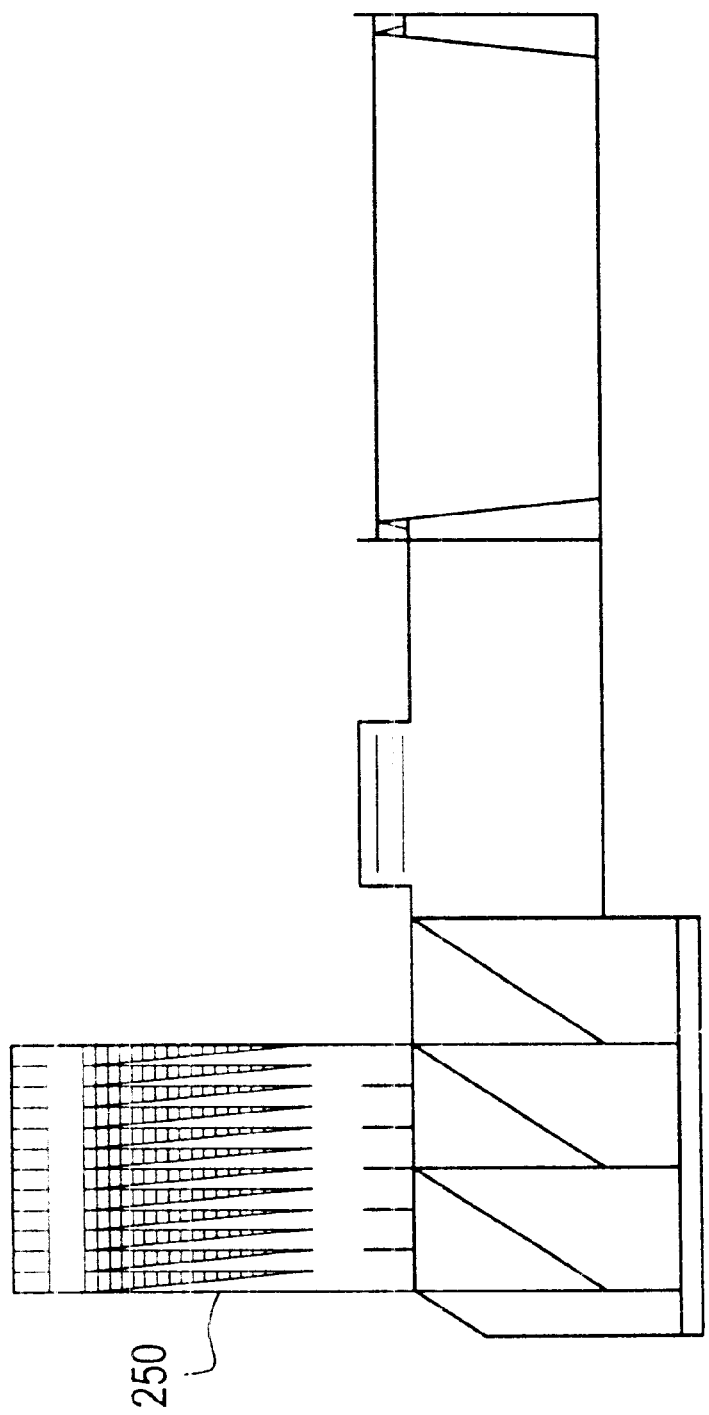
FIG. 5 illustrates the arrangement of the structure of the flexible circuit board device after a third folding step.

FIGS. 3, 4 and 5 illustrate the respective first, second, and third steps by which the multi-layer folded flexible circuit is folded upon itself to cause a reduction in both the width and the length of the open layout shown in FIG. 2.

In FIG. 3, it can be seen that lower foldable strips 220 and upper foldable strips 240 have been folded across their diagonal lines. This first folding step causes the foldable strips 220,240 to fold into substantially triangular shape. This folding over of the foldable strips causes the attached intermediate rigid portions 230 to substantial stack upon each other, with the intermediate rigid portion connected to the left most upper foldable portion extending out the most in a leftward position approximately perpendicular to the connector board 250, and the intermediate rigid portion connected to the right most upper foldable portion extending out the least leftward position approximately perpendicular to the connector board 250.

FIG. 4 shows the second folding step of the folded flexible circuit, wherein the lower rigid portion is folded in an upward position so as to be stacked onto the intermediate portions 230. The actual point of folding is horizontally across the edge of the lower foldable strips 220.

FIG. 5 shows the third folding step of the folded flexible circuit, wherein the connector board 250 is folded downward so as to be stacked on the intermediate portions 230. Similar to the second step, the actual point of folding is horizontally across the upper foldable strips 240, which permits the connector board 250 to be stacked onto the intermediate rigid portions.

Figure 6:
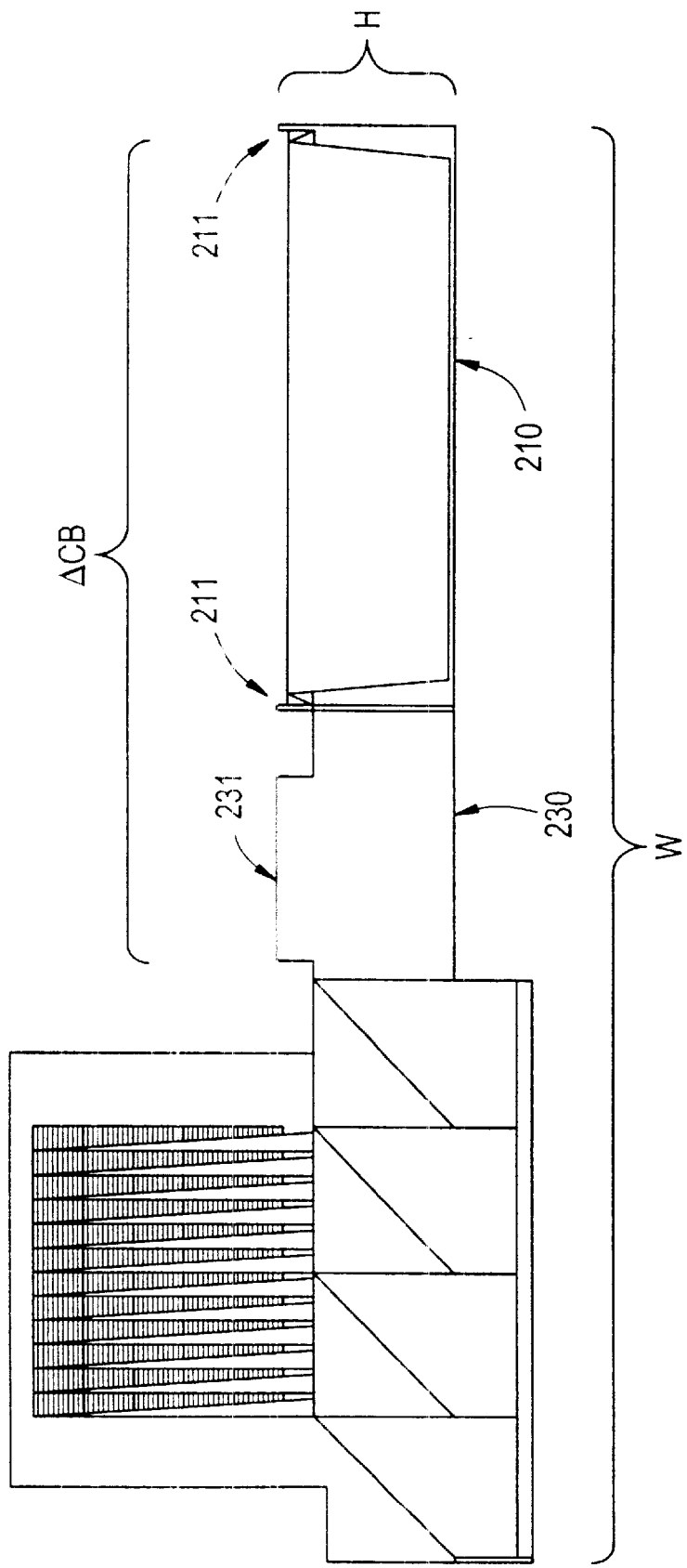
FIG. 6 shows a more detailed close-up of the circuit board device shown in FIG. 5.

FIG. 6 shows a more detailed enlargement of FIG. 5. It can be seen that the upper edge of the lower rigid portion 210 is aligned with the upper edge of the intermediate portions 230. Also, the edge of the tab 231 on the intermediate portion (as shown in FIG. 2) is in alignment with the lips 211 of the lower rigid portion 210.

In a demonstration of the space savings achieved by the present invention, a model was made in which the combined dimensions of lower rigid board 210, lower foldable strips 220, intermediate portions 230, and upper foldable portions 240 was approximately 9.75 inches long by 5.75 inches wide when fully extended (as shown in FIG. 2) amounting to a total area of 56 square inches. After the third folding step (shown in FIG. 5) the width (marked by AW@ in FIG. 5) and the height (marked by the AH@ in FIG. 5) totaled 11.75 inches by 1.5 inches, or a total area of only 17.625 inches, amounting to a reduction of approximately, 69% of the unfolded area.

Additionally, when one considers that part of the folded combination of the lower rigid portion 210, foldable strips 220, intermediate rigid portions 230, and upper foldable portions 240 are essentially folded in back of the connector board, the actual dimensions extending out from the connector board 250 (according to the above model) was approximately 6 inches by 1.5 inches (the 6 inch area marked by the delta CB in brackets) for a total surface area of only 9 inches, an approximate 83% reduction in area from what originally extended beyond the connector board 250. While it is true that the extension is now perpendicular rather than vertical (as shown in FIG. 2 when the folded flexible circuit device is fully extended) both the width and length of the extended area now extend beyond the connector board 250 by a total area of only 9 inches, according to the above model.

Second Embodiment Kinestatic Charge Detector

In the second embodiment, the present invention is embodied for use in a Kinestatic Charge Detector (KCD). While the second embodiment is directed to such a specific embodiment and recites specific dimensions, it is understood by persons of ordinary skill in the art that the multi-layer folded flexible circuit described above can be used in any type of device other than KCD, where a savings of space is either required or desirable.

Figure 7A:
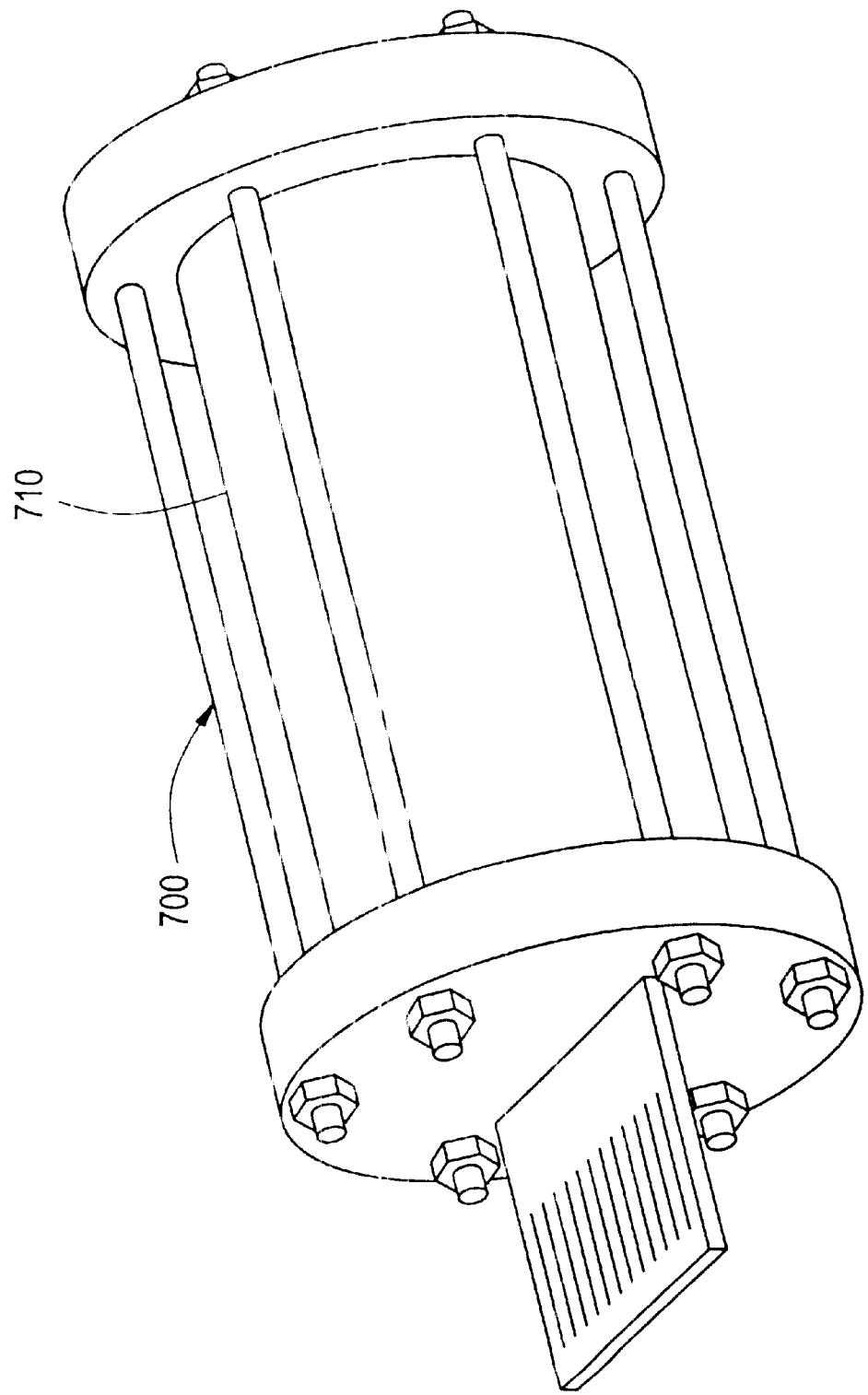
FIG. 7A illustrates a Kinestatic Charge Detector, which is one example of the plurality of application suitable for the present invention.

FIG. 7A illustrates a KCD 700 having a tubular design which includes a tubular chamber 710. The signal is captured by a multitude of collector channels that need to be drawn out of the chamber and coupled to the interfacing electronics.

The collector channels can be drawn out from the circular surface of the tube by drilling a slot through the chamber. However, this drilling step nullifies the advantages of having a tubular design since any slot on the surface of a tube greatly reduces its mechanical strength. To preserve the advantages of the cylindrical structure, the collector channels have to be drawn from the ends of the tube.

As shown in FIG. 7B, the collector board 710 (which must be arranged inside the KCD chamber 700 of FIG. 7A) has very tight specifications and poses a tough challenge for the manufacturing technology. It consists of a series of thin electrodes, 0.05-cm thick and spaced 0.05 cm apart (not shown), laid on a PCB. These electrodes determine the spatial resolution of the system in one dimension. For a large field-of-view detector a total of 576 electrodes are selected to cover the entire view of 30 cm. All these electrodes accurately converge at the X-ray focal spot (approx. 150-cm away).

The entire circuit board 705 can be made using flexible circuits and then folded in a novel way to achieve the desired stacking and compactness that would facilitate its use in the KCD 600. Originally designed to replace bulky wiring harnesses, flexible circuitry is often a good solution for the miniaturization required in current, cutting-edge electronic assemblies. Thin, lightweight and ideal for compact and complicated devices, its design solutions range from singe-sided conductive paths to complex, multilayer three-dimensional packaging.

The flexible circuitry used is an array of conductors bonded to a thin dielectric film. It has the unique property of being a three-dimensional circuit that can be shaped in multiplanar configurations, rigidized in specific areas, and molded to backer boards for specific applications.

As in the first embodiment, the flexible circuitry can include either an etched copper or printed polymer thick film circuit pattern over a flexible dielectric base. A dielectric film base, in most cases, is either Polyimide (generic name) (Kapton Dupont trademark) or Polyethylene Terephalate Polyester (generic name) (Mylar Dupont trademark) usually ranging from 1 to 5 mils in thickness. It has an exposed layer of copper coated with a photosensitive material; imaged with a circuit pattern and etched to establish the conductor traces. This board is finally laminated to make the flex circuit touch and abrasion resistant. Flexible circuits are frequently stiffened, using a thicker piece of Kapton or a piece of FR4 cut to a similar shape as the flex circuit and attached with an adhesive. Stiffeners are usually attached where the flexible board meets a connector or where additional support for components is required.

If all the components are on one side of the circuit board, it is cheaper to have a double-sided flex and laminate a piece of FR-4 rigidizer on the backside of it. The FR-4 is not electrically connected in any way to the vias or the actual flex; it only stiffens the flex.

FIG. 7B shows the circuit 705 layout. Different parts of the circuit are as labeled. The collector board 710 will remain inside the chamber of the KCD. The connector part 750 is where all the channels are arranged to facilitate a connector. This part will be outside of the chamber. The first flexible strips 720, rigid strips 730, and second flexible strips 740 are used for folding and routing the conductors out of the chamber. The entire circuit is made from flexible circuit. The description of the various parts is as under.

COLLECTOR BOARD 710: This is a one rigid board carrying a total of 576(N) conductors, each 0.025 cm wide and spaced 0.025 cm apart. All the conductors are planar and point to the focal spot 151-cm away in the same plane. It is made rigid by laminating a piece of FR4 material of same size on its backside after the folding process.

First flexible strips 720: This part consists of four separate strips of flexible circuit. The four strips are accomplished by cutting a slot in the flex circuit along the solid lines. Each strip contains 144 (N/4) conductors connected to the corresponding conductors in the collector board 710. The conductors are fanned out a little so as to maintain the conductor width and spacing uniform and same as collector board 710. These strips are used in the actual folding process. This part stays inside the chamber under the collector board after the folding and assembly is complete.

Rigid strips 730: This part consists of four separate strips of rigid board. Each strip is correspondingly connected to a first flexible strip 720. Each of these rigid strips has the same conductor details the first flexible strips 720. In this embodiment, the last strip on the right has a tab on its side, which carries extra conductors for the other voltage supplies in the chamber. All the rigid strips 730 are finally made rigid by laminating with FR4. The strips after folding are stacked on top of each other and they pass through the pressure seal in the end cap of the chamber. Finally, they stay partly outside and partly inside the chamber.

Second flexible strips 740: This part is similar to the first flexible strips 720. All conductor details stay the same and some fanning of the conductors is utilized to have a definite arrangement in the following part. This part is flexible too and is used in the folding. It remains outside the chamber after assembly.

CONNECTOR BOARD 750: This part is a rigid part where the connectors will be connected. In most part of this board the conductor thickness and spacing is 0.01 cm. The conductors are routed in an organized manner and arranged in 12 groups of 48 conductors each. The conductors in each group are further arranged to facilitate a connector. The donuts represent the termination of conductors in electroplated-through holes for the connector.

The entire circuit is laid out on a double-sided flexible substrate having a uniform thickness of 8 mils. A ground plane (shown in FIG. 2), i.e. a uniform copper layer connected to ground potential, on the second layer helps to reduce the crosstalk between two layers when they are stacked one on top of the other. It also eliminates the volume leakage reaching the conductors in the collector board area from other high voltage areas in the chamber.

Figure 8A:
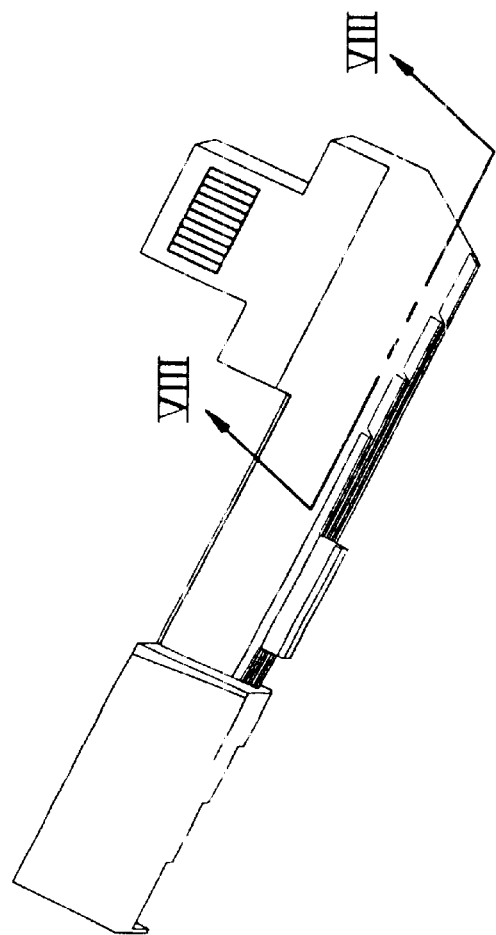
FIG. 8A is a perspective view of the Folded Flexible Circuit Board shown in FIG. 7 and used in the Kinestatic Charge Detector of the second embodiment.

The main reason for using the flex circuit is to achieve compactness due to the space limitations inside the chamber. This is achieved by folding the circuit board in a novel manner. The dashed lines on the flexible strips 720, 740 represent the actual fold lines. The first flexible strips 720 are folded along the 45-deg lines all in the same direction. Corresponding to the folds in each strip 720, a counter fold is performed in the opposite direction in each second flexible strip 740. Due to this, the rigid strips 730 are stacked up on top of each other. The folding must be performed carefully and precisely so as to achieve maximum alignment of rigid strips 730. Once these steps are carried out, the collector board 710 is folded back onto the first flexible strips 720. Likewise, the connector board 750 is folded flat onto the second flexible strips 740, which have been folded. After these folds the circuit board will look as shown in FIG. 8A.

After folding, the different strips are then bonded together resulting in a composite structure. Flexible circuits with rigid bases are extremely reliable. The CAD design for a flexible circuit is considerably faster and simpler than the design of a rigid multilayer circuit. A rigid multilayer circuit has to be designed in multiple layers and the layers then need to be connected with the help of electroplated vias. The interconnection complexity in a Gerber file, standard file format in circuit board industry, shoots up rapidly as the number of layers increase, significantly increasing the possibility for design errors. Flexible circuitry offers the benefit of planar point-to-point connections.

In addition, design complications related to interconnectivity between layers can be avoided by working on one plane. The multilayering, in case of the flexible circuit board, is just a simple process of an organized and defined folding.

Now the collector board 710 is inserted all the way in through one end-cap 701 of the chamber 700. The collector board 710 must be made rigid to achieve flatness.

In addition, connector board 750 needs to be rigidized so that it has the mechanical strength to hold 12 connectors. The circuit board has to pass through a pressure seal to exit the chamber, which encloses gas at high pressures. The stack of rigid strips 730 is exactly where the circuit board exits the chamber. Hence, the rigid strips 730 must be reinforced to effectively hold the pressure.

Figure 8B:
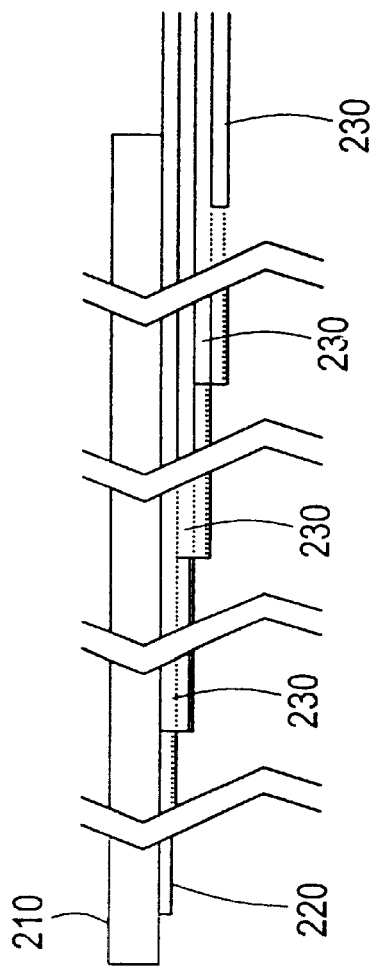
FIG. 8B is a cross-sectional view of FIG. 8A.

FIGS. 8A and 8B show a perspective view and a cross sectional view of the Folded Flexible Circuit Board, illustrating that the intermediate rigid strips 730 at least partially stack on each other.

Figure 9A:
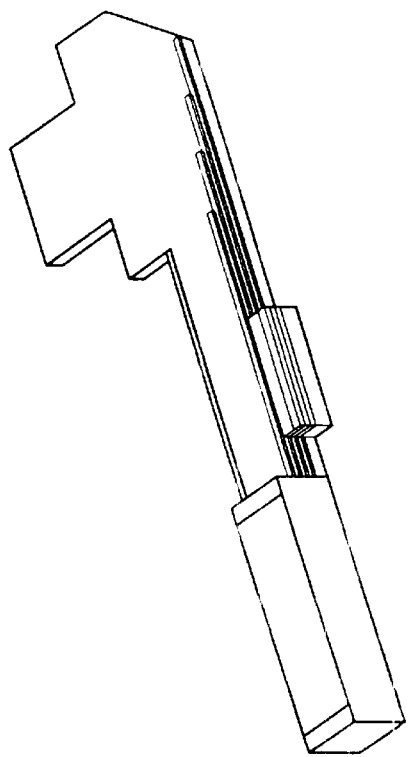
FIG. 9A is a perspective view of the Folded Flexible Circuit of the present invention having rigid bases.
Figure 9B:
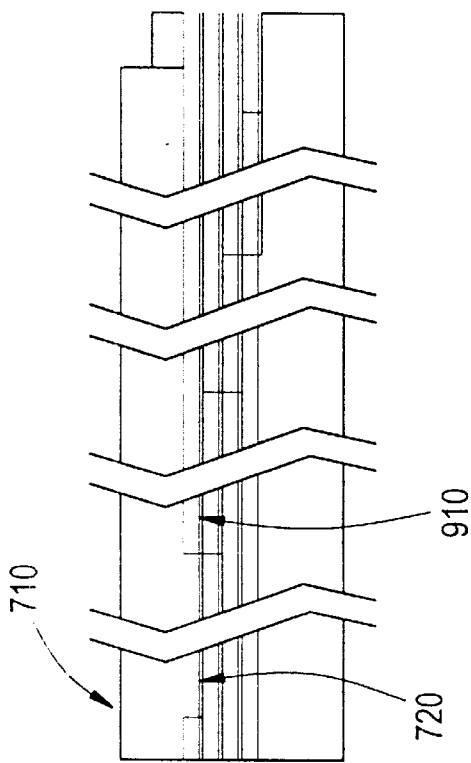
FIG. 9B is a cross-sectional view of FIG. 9A.

FIGS. 9A and 9B show a perspective view of the folded flexible circuit board with rigid bases. The rigid bases 910 (shown in FIG. 9B) for the rigid strips 730 are designed with varying thickness to allow for a notch to be cut for the pressure seal. Also, all the rigid bases 910 for the rigid strips 730 may have a tab, not included on the flexible circuit board layout. The reason is to provide a uniform thickness and a straight edge for the final folded circuit board. These tabs are carefully positioned on each of the tabs as their position depends on the folding of the first and second flexible strips 720 and 740. After bonding the rigid bases to the collector board 710, rigid strips 730, and connector board 750, the final thickness of these parts are: 1) collector board 710: 0.254 cm; 2) first flexible strips 720: 0.03 cm; 3) rigid strips 730: 0.05 cm (the fourth or rightmost rigid strip has a thickness of 140 mils for the purpose of a notch); 4) second flexible strips 740: 0.03 cm; and 5) connector board 750: 0.635 cm. The rigid bases are laminated to the flexible circuit after the folding is completed.

Hence, the same multilayering, as in conventional rigid circuit board, can be achieved in a different way with a multitude of benefits. The simple Afolding flexible board@ offers a significant saving in the cost; typically, a factor of four to five per board for this application, as compared to rigid multilayer boards. There are other advantages too, associated with the usage of flexible circuitry. There is considerable reduction in the weight of the board, due to the usage of thin dielectrics, allowing a simpler design of the pressure seal. Since the KCD detector is a pulsed (explain) application, the capacitance between the conductors plays a very important role. Excess capacitance could integrate unwanted pulses and bypass valid signals. The flexible circuit design eliminates the need for holes on the Collector Board. This way, the channel-to-channel crosstalk can be kept to a minimum since the maximum crosstalk is due to the holes, with pads that are much wider than the conductors, thereby narrowing the gap between them. The elimination of holes is also economical since the holes are expensive to fabricate and electroplate. Flexible circuit design, both, requires and permits looser tolerances than rigid circuit boards, and offers flexible connector geometry, which is a substantial benefit to any project in design stages.

For kinestasis, the KCD needs to be mounted on a linear drive and scanned across the patient. Vibrations and shocks induced by the moving parts in the scanning mechanism can crack the rigid PCB=s and are enough to damage the signal beyond recovery. But flexible circuits are little affected by these shocks, and even provide excellent damping for acoustic vibrations. Apart from that, flexible circuits are touch and abrasion resistant due to the sandwiched construction and undue stresses and strains on individual conductors are avoided.

Flexible circuitry also offers excellent electrical performance due to the low dielectric constant of the substrate. A lower dielectric constant allows faster electrical signal transfer. Flexible boards also have an improved thermal performance thus providing faster heat dissipation. A high glass transition or melting point allows the circuit to operate better at higher temperatures. Signal quality improves because of increased impedance control and uniform electrical characteristics; always desirable for high-speed applications. Assembly costs and complications are greatly reduced. All these factors provide a long life and an improved performance to the flexible circuit board. Higher circuit density and improved aesthetics can be further motivations for a flexible circuit board.

The benefits of using flexible circuits are many. The folding flexible board geometry provides an inexpensive and easy method to route high-density conductors through a small space in a structured, precise and reproducible manner. Without the folding geometry, the detector would have to be substantially bulkier or have a reduced number of detector channels. This concept can be useful in any application that involves routing of high-density conductors through inadequate space. Its application spans many modern electronic gadgets, since miniaturization is the prime objective today. The limit to miniaturization is limited, not only by the individual electronic components, but also by the issue of interconnectivity between electronic components and interfaces to peripheral devices.

In this embodiment, the collector board required for the KCD detector of the second embodiment must be 30 cm×10 cm in dimension inside the conventional chamber. It must be rigid and as flat as possible. The collector board carries 576 planar ion collecting copper conductors all converging exactly at the focal spot. These conductors have to be routed out of the chamber from the 10-cm side of the board. This is accomplished using a flexible-rigid circuit design. The conductors after coming out of the chamber are interfaced to the data acquisition system via connectors.

However, as the advantages of using a flexible, 3-dimensional circuit come to light, the applications of flex can be extended beyond that. It can replace traditional hardboard in applications with space limitations and high-density conductors. The entire circuit board can be fabricated as a flex and then folded in a novel way to achieve the desired stacking and compactness. Significant compactness is achieved by transforming the two-dimensional routing of the conductors, in case of rigid circuit boards, to a three-dimensional arrangement in a folded flexible circuit board. The folding results in dramatic savings in the area needed to draw out the conductor lines associated with the single rigid circuit board, by slightly increasing the thickness. The added thickness is not an issue for space requirements since, in any circuit board device, there is ample space available in the thickness dimension for heat dissipation from the circuit board. Thinner individual circuit boards can be used in a folded geometry without compromising the mechanical rigidity, if only one rigid circuit board was to be used.

Although a person of ordinary skill in the art understands that there are variations in the process which are clearly within the spirit of the invention and the scope of the appended claims, a prototype was folded according to the following process, which the inventors believe to be a best mode of practicing the invention:

The folding process commences after the manufacturing process. The flexible circuit is manufactured according to the design with tight specifications. Some of the parts needed for the folding process are:

(a) The planar flex circuit fabricated according to the design;

(b) Stiffeners (FR4) for the different strips of intermediate portions 230, according to the design;

(c) PSA (3M Pressure Sensitive Adhesive) used to adhere the various stiffeners to the circuit. The PSA is a peel-and-stick adhesive having a thickness of 0.002";

(d) Torr Seal Resin Sealant. This epoxy is used in high-vacuum applications and is perfect for the seal area in the KCD chamber to hold high pressure; and (e) Shims (spacers) to be used in the press. They are strips of FR4 of the dimensions 12"×2"×0.355". The thickness is calculated by considering the various layers in the folded flex circuit. The thickness of these shims determines the final thickness of the folded circuit.

After all the different pieces are ready, the folding process can begin. They are listed in steps below:

1. Lay the flex circuit on a flat surface and clean both its surfaces with alcohol.

2. Cover the front surface of lower rigid portion 210 completely and the tab 231 on portion 232 with high temperature Kapton tape (3M #5413). This is done to prevent any moisture from oxidizing the exposed tin-plating on the lower rigid portion 210 conductors. While taping, be careful to not overlap any two adjacent layers of tape. This is very important since any overlapping of tape will create a depression on the collector surface, after the folded circuit is pressed in a mechanical press.

3. Pieces of PSA, cut to the size 3"×3", should be pasted to the Part B regions of the circuit on the ground side (back surface). The exact placement of the PSA is very important (measured 4.125" from the open end of lower rigid portion 210).

4. Similar pieces of PSA must be stuck to the upper foldable strips 240 regions on the conductor surface (front surface). Again, the placement of the PSA should be precisely in the correct area (measured 5" from the open end of connector 250).

5. The stiffener for lower rigid portion 210 must be readied by bonding PSA on its backside. This stiffener then needs to be carefully bonded to the back surface of lower rigid portion 210. High precision is required. Hence, the stiffener is kept on a flat surface and its PSA cover is peeled off. Using a flat edge to align the flex, lower rigid portion 210 of the flex is carefully positioned on the stiffener. The exact superimposition on the stiffener is imperative since any misalignment will be multiplied along the length of the flex circuit and the folds will not overlap. Once the correct placement is established, secure the bond by pressing the circuit with a roller.

6. Fold the entire circuit flat on to itself, along the edge of lower rigid portion 210 stiffener. Again, secure the folds using a roller. Be careful to not break any of the conductor lines.

7. Perform pre-folds on lower foldable strips 220 in the appropriate direction. These folds are only temporary and to facilitate an easy final folding of the complete circuit.

8. Perform similar pre-folds on upper foldable strips 240 in the appropriate direction (counter to the folds in lower foldable strips 220). These folds must be loose too.

9. The final fold for lower foldable strip 221 is performed in such a way that the tab 231 on intermediate portion 232 exactly aligns with the edge of lower rigid portion 210. Once this is done, the fold is finalized. While performing the fold, the adjacent strips should be carefully held so that the tear does not go beyond the tear stop.

10. Now the folds for lower flexible portions 222, 223 and 224 are finalized such that after folding, the intermediate portions strips 233, 234 and 235 align with the straight edge of strip 232. The folds are finalized using a roller.

11. Now the folds on upper foldable strips are performed using Part E to align with the straight edges. The folds should be such that all the strips 232–235 of intermediate portion 230 are aligned with the straight edge of lower rigid portion 210. Then these folds should be finalized.

12. The PSA cover on the foldable portions 220 and 240 are carefully peeled off and then pressed again with a roller. Now the folds are permanent. The folding process is complete.
13. After the folding process is complete, the seal area and the fold area have to be filled with epoxy to give a solid circuit board. Torr Seal is used for this application. Adequate amount of Torr Seal is mixed homogeneously and kept ready for application. The work-time associated with Torr Seal is only 30 min. so the next five steps have to be completed within that time.
14. The backside of lower rigid portion (with stiffener) is laid on a flat clean surface and then a uniform layer of epoxy, thickness 0.005", is applied on it. Then the folded flexible strip 224 and intermediate strip 235 is placed on it. Next, a layer of epoxy is spread on the flex and the stiffener for intermediate strip 235 is placed on it. The stiffener must be carefully aligned with the flex.
15. The above step is repeated for the lower foldable strips 221, 222 and 223, using intermediate portions 232, 233 and 234 as stiffeners. The alignment of various flex strips and stiffeners must always be kept in check. Sufficient epoxy must be applied in the tab area.
16. After the folded circuit is filled with epoxy, the sides of the circuit are covered with Kapton tape to prevent the glue from squirting out from the sides. Now the circuit is ready to be hard-pressed in the mechanical Press.
17. Two sheets of cardboard are kept on the steel base plate for the Press. Then a sheet of Mylar (0.005" thick) is placed on the cardboard sheets. Then the folded circuit board is kept on the Mylar sheet with lower rigid portion 210 facing up. The circuit board is then covered with another sheet of Mylar and the FR4 shims are arranged around the circuit board. Mylar is used because the epoxy does not bond to it. Then another sheet of cardboard is placed, followed by the top steel base plate. The cardboard is used to make the pressure uniform since it deforms easily.
18. The entire sandwich is then put in a press at 9000 pounds and 140° C. for 30 min. The curing time for epoxy at 140° C. is 30 min. The final thickness of the circuit board is determined by the thickness of the shims.
19. After the folded circuit is taken out of the press, it is set aside for 24 hours for the epoxy to harden.

The circuit board can be brought back to the required dimensions by taking off the excess epoxy squirted out in the Press. Again, it is stressed that a person of ordinary skill in the art understands that the above process does not have to be followed in the exact order, or include all of the steps shown, but it is known to the inventors as a best mode of practicing the invention.

Various modifications are made to the above-described embodiments, which are in within the spirit and scope of the present invention, and the appended claims. For example, the number of strips can be more or less than four, the fold lines do not have to be 45 degrees and could be any angle according to need. The need in part would be based on the dimensions of the strips, and the degree of compactness required.

There may be devices where it would not be required to have an equal ratio of intermediate strips to first flexible strips or second flexible strips. For example, the four first flexible strips could connect to only two intermediate rigid boards, or one, or any number according to need. The same is true regarding the second flexible strips.

It is also within the spirit and the scope of the invention that the first or second flexible strips could attach to the intermediate portion strips from substantially perpendicular angles as well as, or in addition, to the substantially vertical layout shown in FIG. 2. The intermediate portions may be made of either a rigid or a non-rigid material. There could also be a need where the attachments are made diagonally. The number of rigid boards could be more or less, or just a single rigid board.

It is also well within the scope of the invention that the flexible circuit, folded in a similar organized way, could be used to connect a separate rigid circuit board to another rigid circuit board. These rigid boards may be multilayer or single-layer and fabricated using any manufacturing technique. The organized folding can be performed with single, as well as multilayer flex boards and hence the flexible circuit used to connect the rigid boards can be multilayer or a single layer board.

In the current embodiment, no heat dissipation mechanism is used, since the conductors only carry nano-ampere signal. However, for circuits involving significant heat dissipation, the performance of multilayer circuit boards can deteriorate. This can be overcome by utilizing a number of different kinds of heat dissipating techniques into the flexible circuit board. These techniques include using water-capillaries (flushing water around the heat producing areas) in the insulator layers of the flexible circuit board, a thermoplate (a circuit board base extending beyond the required circuit board area to provide more surface for cooling) as part of the insulation layer, a thermocouple plane as part of the insulation layer (a junction of two dissimilar metals, at a potential difference, to produce thermoelectric refrigeration) or a fan (blowing air on and through the circuit board).

What is claimed is:

1. A process for manufacturing a folded flexible circuit board comprising the steps of:
    (a) providing a circuit board comprising a lower rigid portion, a plurality of lower foldable strips electrically connected to the lower rigid portion, a plurality of intermediate portions connected at a first end to a second end of the lower foldable strips, a plurality of upper foldable strips connected to a second end of the intermediate portions, and a connector board connected to an opposite end of said upper foldable strips;
    (b) folding said lower foldable strips and said upper foldable strips diagonally in opposite directions to each other so that each of the intermediate portions at least partially stack upon each other;
    (c) folding said lower rigid portion back on the stack of intermediate portions by folding said lower foldable strips horizontally so that said lower rigid portion stacks on said intermediate portions; and
    (d) folding the connector board onto the upper foldable strips and the stack of intermediate portions by folding said upper foldable strips horizontally so that said connector board stacks on the upper foldable strips and the intermediate portions.

2. The method according to claim 1, further comprising:
    (e) bonding said folded flexible circuit board into a folded composite multilayer structure using any form of glue or epoxy.

3. The method according to claim 1, wherein step (b) first includes
    (f) providing diagonal prefolds on said lower foldable strips and said upper foldable strips so that the strips fold in opposite directions.

4. The method according to claim 1, wherein step (a) includes providing a tab to at least an outer edge of one of a right-most and left-most intermediate portion.

5. The method according to claim 1 further comprising laminating a backside of the intermediate portions.

6. The method according to claim 1, further comprising:
(g) connecting said folded flexible circuit board between two separate rigid circuit boards.

* * * * *